(12) United States Patent
Ostrowicki et al.

(10) Patent No.: US 12,068,261 B2
(45) Date of Patent: *Aug. 20, 2024

(54) STRAIN-INDUCED SHIFT MITIGATION IN SEMICONDUCTOR PACKAGES

(71) Applicant: TEXAS INSTRUMENTS INCORPORATED, Dallas, TX (US)

(72) Inventors: Gregory Thomas Ostrowicki, Dallas, TX (US); Amit Sureshkumar Nangia, Murphy, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/822,960

(22) Filed: Aug. 29, 2022

(65) Prior Publication Data

US 2022/0415824 A1     Dec. 29, 2022

Related U.S. Application Data

(63) Continuation of application No. 17/192,511, filed on Mar. 4, 2021, now Pat. No. 11,430,747.

(60) Provisional application No. 63/133,216, filed on Dec. 31, 2020.

(51) Int. Cl.
  *H01L 23/00* (2006.01)
  *H01L 21/56* (2006.01)
  *H01L 23/31* (2006.01)
  *H01L 23/64* (2006.01)

(52) U.S. Cl.
  CPC ............ *H01L 23/562* (2013.01); *H01L 21/56* (2013.01); *H01L 23/3107* (2013.01); *H01L 23/647* (2013.01); *H01L 24/48* (2013.01); *H01L 24/85* (2013.01); *H01L 2224/48245* (2013.01)

(58) Field of Classification Search
  CPC ..................................................... H01L 23/647
  See application file for complete search history.

(56) References Cited

U.S. PATENT DOCUMENTS

| | | | |
|---|---|---|---|
| 6,497,824 B1 | 12/2002 | Chen et al. | |
| 7,039,888 B2 | 5/2006 | Steinmann et al. | |
| 7,482,214 B2 * | 1/2009 | Rost | H01L 29/66477 |
| | | | 438/518 |
| 10,352,792 B2 | 7/2019 | Nurmetov et al. | |
| 10,353,503 B2 | 7/2019 | Shih et al. | |

(Continued)

*Primary Examiner* — Yu-Hsi D Sun
(74) *Attorney, Agent, or Firm* — Yudong Kim; Frank D. Cimino

(57) ABSTRACT

A semiconductor package includes a semiconductor die including a semiconductor substrate, a strain-sensitive component located within or over a metallization layer of the semiconductor die, wherein a parameter of the strain-sensitive component exhibits a longitudinal shift due to a longitudinal strain and a transverse shift due to a transverse strain, and a mold compound covering the semiconductor die and the strain-sensitive component. The semiconductor package, including the semiconductor die and the mold compound, defines an orthogonal package-induced strain ratio on the strain-sensitive component on the semiconductor die surface. The strain-sensitive component is located such that the longitudinal shift due to package-induced strains offsets the transverse shift due to the package-induced strains.

29 Claims, 6 Drawing Sheets

(56) References Cited

U.S. PATENT DOCUMENTS

| | | | | |
|---|---|---|---|---|
| 2002/0063292 A1* | 5/2002 | Armstrong | ............ | H01L 27/092 257/E29.051 |
| 2008/0036005 A1* | 2/2008 | Armstrong | ...... | H01L 21/823807 257/E27.064 |
| 2008/0122002 A1* | 5/2008 | Pei | ...................... | H01L 29/7843 257/E21.632 |
| 2009/0065867 A1* | 3/2009 | Yin | ..................... | H01L 29/7843 257/E27.111 |
| 2020/0096370 A1 | 3/2020 | Shen et al. | | |

* cited by examiner

STRAIN-INDUCED SHIFT MITIGATION IN SEMICONDUCTOR PACKAGES

CROSS-REFERENCE TO RELATED APPLICATIONS

This application is a continuation of U.S. patent application Ser. No. 17/192,511, entitled "Strain-Induced Shift Mitigation in Semiconductor Packages," filed Mar. 4, 2021, which claims the benefit of U.S. Provisional Application No. 63/133,216, entitled "Strain-Induced Shift Mitigation in Semiconductor Packages," filed Dec. 31, 2020, and each of which is hereby incorporated by reference in its entirety herein.

TECHNICAL FIELD

This disclosure relates to semiconductor devices.

BACKGROUND

Semiconductor packages provide support for a semiconductor die, such as an integrated circuit, and associated bond wires or other interconnects, provide protection from the environment, and enable surface mounting of the die to and interconnection with a printed circuit board (PCB). Package material, such as mold compound, offers a protective layer over components of the package, including the semiconductor die.

Package components, such as semiconductor dies, may experience package-induced stress such as stress from bonding between the component and package material and/or bonding between the component and a die pad or leadframe.

For strain-sensitive components, such as thin-film resistors (TFRs), strain changes the circuit parameters associated with the devices. These circuit parameters, such as the resistivity of resistors and the frequency of an integrated oscillator, can respond differently to strain in longitudinal and transverse directions, so determining values for each of the major strain components is desirable in order to accurately measure and respond to the strain. Previous methods have utilized combinations of diffused resistors to extract the strain components. However, these solutions tend to add both circuit complexity and require complex mathematical calculations during post-processing of the resultant measurements.

As another example, components may be located in large, matched arrays where strain gradient effects of different components offset. Such solutions are also not practical for circuits that are sensitive to global strain and rely on absolute value output such as bandgaps.

In addition to measuring strain and post-processing, further techniques may be utilized to mitigate strain on sensitive components. For example, sensitive components may be intentionally placed near the center of a semiconductor die where strain is more uniform. Alternate package constructions such as ceramic cavity reduce magnitudes of die strain compared to standard plastic packages. By reducing strain on the semiconductor die, such package construction provides one option to address circuit components that are sensitive to strain.

BRIEF SUMMARY

As disclosed herein, the layout and orientation of strain-sensitive components, such as TFRs, on a surface of a semiconductor die, such as within or over a metallization layer of the semiconductor die, is selected to balance strain-induced shift of a parameter of the component. The disclosed examples mitigate strain-induced variation for any number of strain-sensitive components, including just one strain-sensitive component. These examples do not require multiple arrays of components, measuring strain, or performing complex mathematical calculations at post-processing to compensate for strain-induced shift.

In one example, a semiconductor package includes a semiconductor die including a semiconductor substrate, a strain-sensitive component located within or over a metallization layer of the semiconductor die, wherein a parameter of the strain-sensitive component exhibits a longitudinal shift due to a longitudinal strain and a transverse shift due to a transverse strain, and a mold compound covering the semiconductor die and the strain-sensitive component. The semiconductor package, including the semiconductor die and the mold compound, defines an orthogonal package-induced strain ratio on the strain-sensitive component on the semiconductor die surface. The strain-sensitive component is located such that the longitudinal shift due to package-induced strains offsets the transverse shift due to the package-induced strains.

In a further example, a method of forming a package includes electrically coupling a semiconductor die to one or more leads. The semiconductor die includes a strain-sensitive component located within or over a metallization layer of the semiconductor die, wherein a parameter of the strain-sensitive component exhibits a longitudinal shift due to a longitudinal strain and a transverse shift due to a transverse strain. The method further includes covering the semiconductor die, and the strain-sensitive component, and partially covering the leads with a mold compound, with the leads remaining exposed on an outer surface of the semiconductor package. The semiconductor package, including the semiconductor die and the mold compound, defines an orthogonal package-induced strain ratio on the strain-sensitive component on the semiconductor die surface. The sensitive component is located such that the longitudinal shift due to the package-induced strains offsets the transverse shift due to the package-induced strains.

DETAILED DESCRIPTION

As disclosed herein, strain-sensitive components, such as TFRs, on a surface of a semiconductor die, such as within or over a metallization layer of the semiconductor die, to mitigate strain-induced shift of the components. Strain affects various parameters of a strain-sensitive component depending on the relative magnitude of orthogonal strains acting on the strain-sensitive component and the orientation of the strain-sensitive component. The physical structure of a semiconductor package and semiconductor die defines the relative magnitudes of orthogonal package-induced strains at any position and orientation along a semiconductor die surface. For example, strain-sensitive components may shift due to a longitudinal strain different than a shift due to due to a transverse strain. The position and orientation of strain-sensitive components is selected such that package-induced strain provides a shift due to longitudinal strain that balances with a shift due to transverse strain. In such a configuration, any magnitude of package-induced strain will have a limited effect on the parameters of the strain-sensitive components of the package.

Figure 1A:
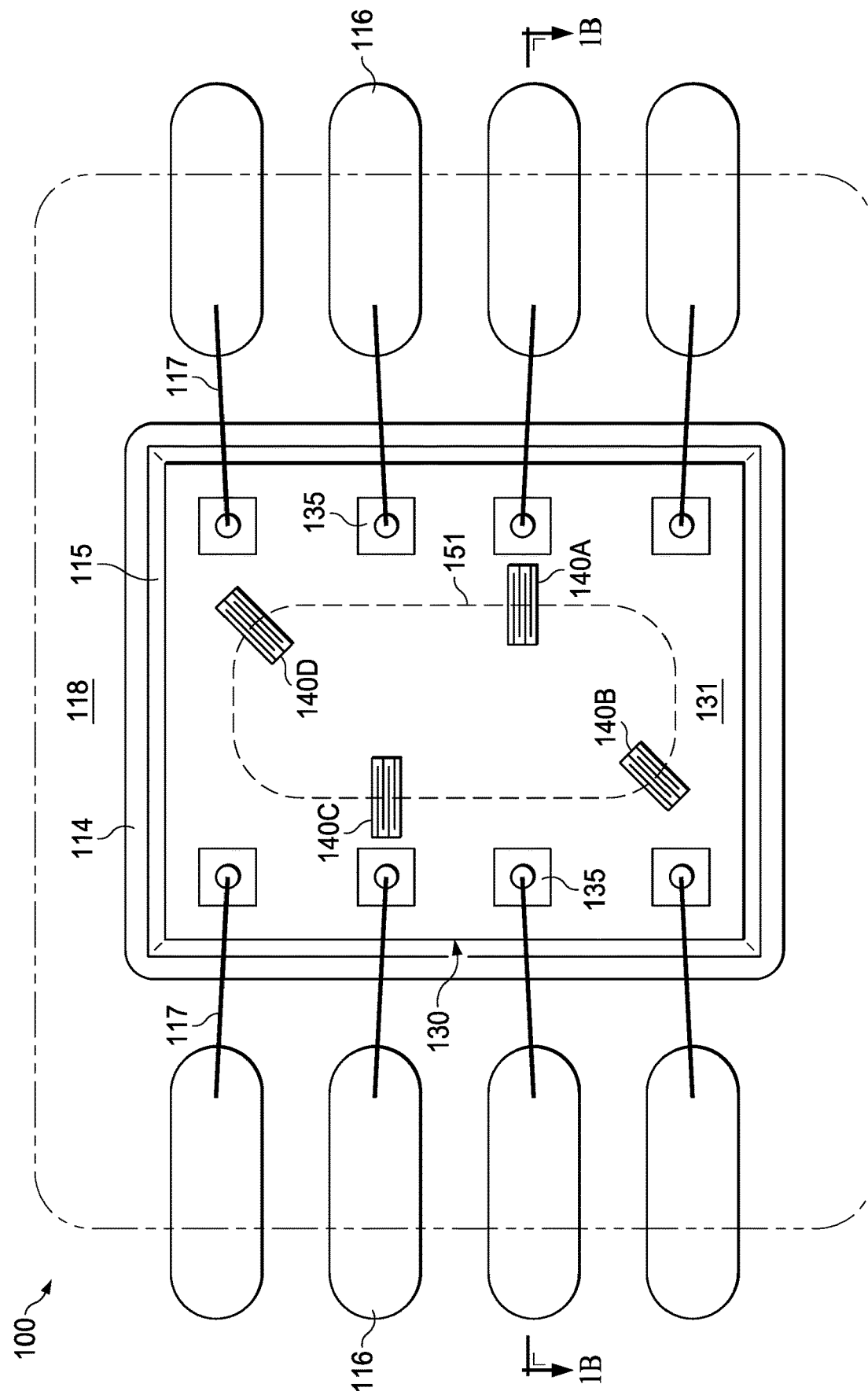
FIGS. 1A and 1B illustrate a top view and a cross-sectional view, respectively, of a semiconductor package including a semiconductor die with TFRs developed above a semiconductor substrate, the TFRs located such that a longitudinal resistance shift due to the package-induced strains offsets a transverse resistance shift due to the package-induced strains.
Figure 1B:
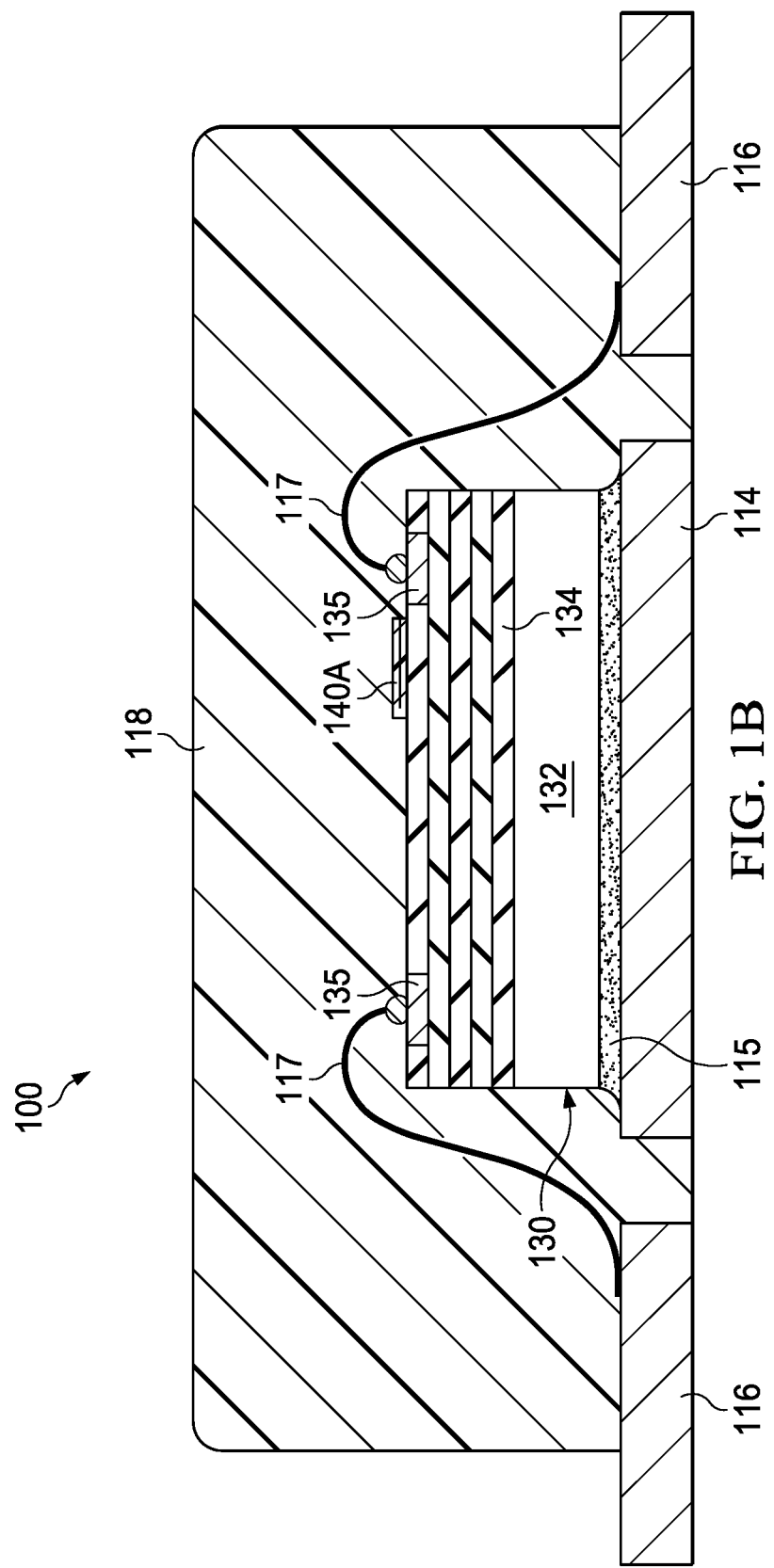

FIGS. 1A and 1B illustrate semiconductor package 100. Specifically, FIG. 1A illustrates a top view of semiconductor package 100, and FIG. 1B illustrates a cross-sectional view of semiconductor package 100. Semiconductor package 100 includes a metallic pad 114 and leads 116, and a semiconductor die 130 mounted to metallic pad 114 with die attach 115. Wire bonds 117 provide electrical connections between leads 116 and bond pads on the active surface 131 of semiconductor die 130. Semiconductor package 100 further includes TFRs 140A:140D (collectively, "TFRs 140") located on surface 131 of semiconductor die 130.

Mold compound 118 covers semiconductor die 130 with TFRs 140 and wire bonds 117, and partially covers metallic pad 114 and leads 116. Metallic pad 114 and leads 116 are exposed on an outer surface of the semiconductor package 100. Leads 116 provide electrical terminals for semiconductor package 100, while metallic pad 114 functions as a heatsink for semiconductor die 130. While semiconductor package 100 is a leaded package, the techniques of this disclosure may be applied to any package configuration, including non-leaded packages such as quad-flat no-leads (QFN), small-outline no-leads (SON), and ball grid array (BGA) packages.

TFRs are one example of strain-sensitive components, and electrical resistance of TFRs is a parameter affected by strain. Other electrical resistors, such as, but not limited to, diffused resistors, ion-implanted resistors, polysilicon resistors, and metal resistors, also represent strain-sensitive components with electrical resistances that may be affected by strain. Other strain-sensitive components may have different properties affected by strain, such as, but not limited to, reactance, impedance, frequency and/or capacitance. The techniques of this disclosure are appliable to any strain-sensitive components suitable for use in semiconductor packages including resistors, inductors, capacitors, oscillators, transistors or other components with parameters affected by strain.

Surface 131 of semiconductor die 130 experiences a package-induced strain within package 100. For example, the package-induced strain may include residual strain from a molding process for mold compound 118, and/or strain due to variations in the coefficient of thermal expansion (CTE) for different elements of package 100, including variation between mold compound 118 and semiconductor die 130. As another example, package-induced strain may occur from residual stress following the mounting of package 100 to an external board, such as a PCB.

Whatever the source of package-induced strain on surface 131 of semiconductor die 130, each of TFRs 140 are positioned such that a longitudinal shift due to the package-induced strains offsets a transverse shift due to the package-induced strains. In the example shown, TFRs 140 are each orthogonal to isoline 151, which represents a principal strain ratio contour, i.e., a value of the maximum difference between orthogonal compressive strains along the die surface 131. As described in further detail with respect to FIGS. 2-5, the longitudinal strain sensitivity to transverse strain sensitivity ratio, referred to herein as the orthogonal strain sensitivity ratio, for TFRs 140 corresponds with principal strain ratio represented by isoline 151. This arrangement allows any longitudinal shift due to the package-induced strains to offset the corresponding transverse shift due to the package-induced strains for each of TFRs 140.

While closer offsets are preferred, any offsets between the longitudinal shift and the transverse shift due to the package-induced strains is helpful to provide more consistent outputs for TFRs across a range of package-induced strains without multiple arrays of components, measuring strain, or performing complex mathematical calculations at post-processing to compensate for strain-induced shift.

Some variation may occur between packages manufactured according to the same design and specifications. Factors in the location and orientation of TFRs 140 on surface 131 may also inhibit placement of TFRs to exactly offset the longitudinal shift due to the package-induced strains with the transverse shift due to the package-induced strains. In some examples, TFRs 140 may each be positioned such that a magnitude of the longitudinal shift due to the package-induced strains is within twenty percent, ten percent, or even five percent of a magnitude of the transverse shift due to the package-induced strains.

In contrast to prior art configurations, TFRs 140 are located outside a center portion 133 (FIG. 5) of surface 131. Outside the center portion 133, TFRs 140 experience more package-induced strain; however, TFRs 140 are oriented along isoline 151, which represents a principal strain ratio contour, to mitigate package-induced shift as a result of package-induced strain on surface 131.

TFRs 140 are nonadjacent rather than configured as TFR arrays. Each of TFRs 140 is separated from each other by at least 25 percent of a width of surface 131. Compared to prior designs including an array of TFRs, the individual TFRs 140 do not utilize from offsetting package-induced shift among multiple TFRs. Instead, the location and orientation of each of TFRs 140 is selected to mitigate package-induced shift for that TFR 140.

Semiconductor die 130 includes at least two layers: semiconductor substrate 132, which is attached to metallic pad 114, and multilayer dielectric 134, which is over semiconductor substrate 132 on the active surface 131 of semiconductor die 130. Semiconductor substrate 132 is formed from a semiconductor such as silicon or silicon/germanium. The inactive surface of semiconductor die 130, the bottom of semiconductor substrate 132, is bonded to metallic pad 114. Multilayer dielectric 134 is formed as a series of build-up layers on top of semiconductor substrate 132 and includes metallization layers providing the functional circuitry (not shown) of semiconductor die 130. Bond pads 135 are exposed in bond pad openings in multilayer dielectric 134 on the active surface 131 of semiconductor die 130. Bond pads 135, provide electrical contact surfaces for wire bonds 117. The bond pads are bonded to metallization layers on top of semiconductor substrate 132, and within multilayer dielectric 134.

TFRs 140 are electrically coupled to a metallization layer of semiconductor die 130. For example, TFRs 140 may be incorporated within the metallization layers or coupled to the metallization layers through contact with bond pads (not shown) on surface 131 of semiconductor die 130.

Multilayer dielectric 134 and the metallization layers of semiconductor die 130 are formed on a semiconductor wafer prior to singulation of semiconductor die 130. For example, metallization layers may represent metal plating layers etched with photolithography, followed by coating with a dielectric layer to fill spaces between the conductive traces of the metal plating layers. The metallization layers include circuit elements such as transistors, diodes, capacitors, and resistors, as well as signal lines and other electrical conductors that interconnect the various circuit elements. As non-limiting examples, such functional circuitry may include an application specific integrated circuit (ASIC), a digital signal processor, a radio frequency chip, a memory, a microcontroller and a system-on-a-chip or a combination thereof. The functional circuitry is generally integrated circuitry that realizes and carries out desired functionality of the package, such as that of a digital IC (e.g., digital signal processor) or analog IC (e.g., amplifier or power converter), such as a BiMOS IC. The capability of functional circuitry may vary, ranging from a simple device to a complex device.

Mold compound 118 provides a protective layer covering electronics of semiconductor package 100. Specifically, mold compound 118 covers semiconductor die 130 with TFRs 140, wire bonds 117, and partially covers metallic pad 114 and leads 116, with metallic pad 114 and the leads 116 exposed on an outer surface of the semiconductor package 100. In this manner, leads 116 provide electrical contact terminals for semiconductor package 100, while metallic pad 114 functions as a heatsink for semiconductor die 130.

Mold compound 118 may be formed from a nonconductive plastic or resin material. Mold compounds suitable for use as mold compound 118 include, for example, thermoset compounds that include an epoxy novolac resin, multi-aromatic resin, multi-functional resins, or similar material combined with a filler, such as silica and/or alumina, and other materials to make the compound suitable for molding, such as accelerators, curing agents, filters, and mold release agents.

Leadframes, such as leadframe containing metallic pad 114 and leads 116, are formed on a single, thin sheet of metal as by stamping or etching. Multiple interconnected leadframes may be formed on a single leadframe sheet, the interconnected leadframes referred to as a leadframe strip. Leadframes on the sheet can be arranged in rows and columns. Tie bars connect leads and other elements of a leadframe to one another as well as to elements of adjacent leadframes in a leadframe strip. A siderail may surround the array of leadframes to provide rigidity and support leadframe elements on the perimeter of the leadframe strip. The siderail may also include alignment features to aid in manufacturing.

Usually die mounting, die to leadframe attachment, such as solder reflowing, wire bonding or metal trace pattering, and molding to cover at least part of the leadframe and dies take place while the leadframes are still integrally connected as a leadframe strip. After such processes are completed, the leadframes, and sometimes mold compound of a package, are severed ("singulated" or "diced") with a cutting tool, such as a saw or laser. These singulation cuts separate the leadframe strip into separate IC packages, each IC package including a singulated leadframe, at least one die, electrical connections between the die and leadframe (such as gold or copper bond wires) and the mold compound which covers at least part of these structures.

Tie bars and siderails may be removed during singulation of the packages. The term leadframe of represents the portions of the leadframe strip remaining within a package after singulation. With respect to semiconductor package 100, its leadframe includes metallic pad 114 and leads 116 although those conductive elements are not directly interconnected following singulation of semiconductor package 100.

Figure 2:
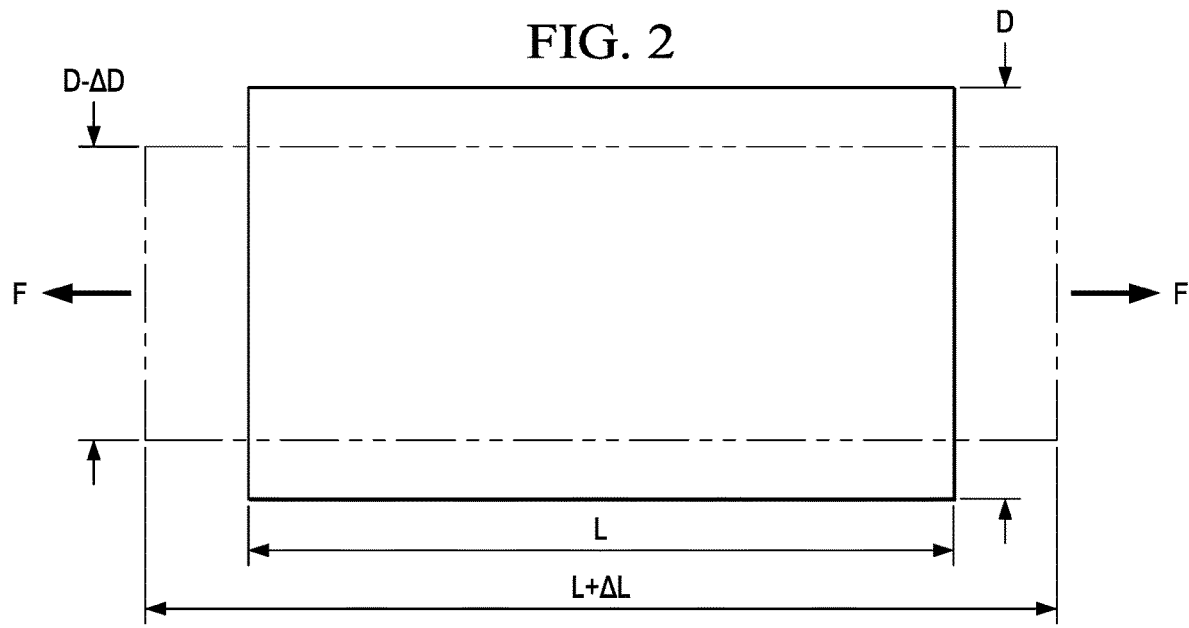
FIG. 2 is a conceptual diagram illustrating longitudinal strain and transverse strain on the semiconductor die of the package of FIGS. 1A and 1B due to package-induced strains.

FIG. 2 is a conceptual diagram illustrating longitudinal strain and transverse strain on semiconductor die 130 due to package-induced strains of package 100. In this conceptual example, package 100 is under uni-axial tensile force F. Realistically, package-induced strains will be more complex. As shown in FIG. 2, F is the longitudinal pull force (representing this simplistic example of package-induced stress). D is the nominal width of semiconductor die 130, ΔD is the change in the nominal width due to the longitudinal pull force, L is the nominal length of semiconductor die 130, ΔL is the change in the nominal length due to the longitudinal pull force.

The strain ratio for semiconductor die 130 corresponds to the following equations:

$$\text{Transverse Strain } (\varepsilon_T) = \Delta D/D \quad \text{(Equation 1)}$$

$$\text{Longitudinal Strain } (\varepsilon_L) = \Delta L/L \quad \text{(Equation 2)}$$

$$\text{Poisson Ratio } (\upsilon) = -\varepsilon_T/\varepsilon_L \quad \text{(Equation 3)}$$

Resistance sensitivity to strain is characterized by the sum of resistance sensitivity to longitudinal strain and resistance sensitivity to transverse strain:

$$\Delta R/R = \gamma_L^* \varepsilon_L + \gamma_T^* \varepsilon_T \quad \text{(Equation 4)}$$

In Equation 4, R is the nominal resistance, ΔR is the net resistance change, $\gamma_L$, is the longitudinal elastoresistance coefficient (property of TFRs 140), and $\gamma_T$ is the transverse elastoresistance coefficient. As shown in Equation 5, in order for there to be no resistance shift due package induced strain (ΔR/R=0), the longitudinal resistance shift must offset the transverse resistance shift.

$$\gamma_L^* \varepsilon_L = -\gamma_T^* \varepsilon_T \quad \text{(Equation 5)}$$

$$\gamma_L/\gamma_T = -\varepsilon_T/\varepsilon_L \quad \text{(Equation 6)}$$

In Equation 6, Equation 5 is rewritten to compare the ratio of longitudinal and traverse elastoresistance coefficients the ratio of longitudinal and traverse strain. Equation 6 demonstrates that there is no resistance shift when the ratio of longitudinal and traverse elastoresistance coefficients is equal to the negative inverse of the ratio of longitudinal and traverse strain.

Figure 3:
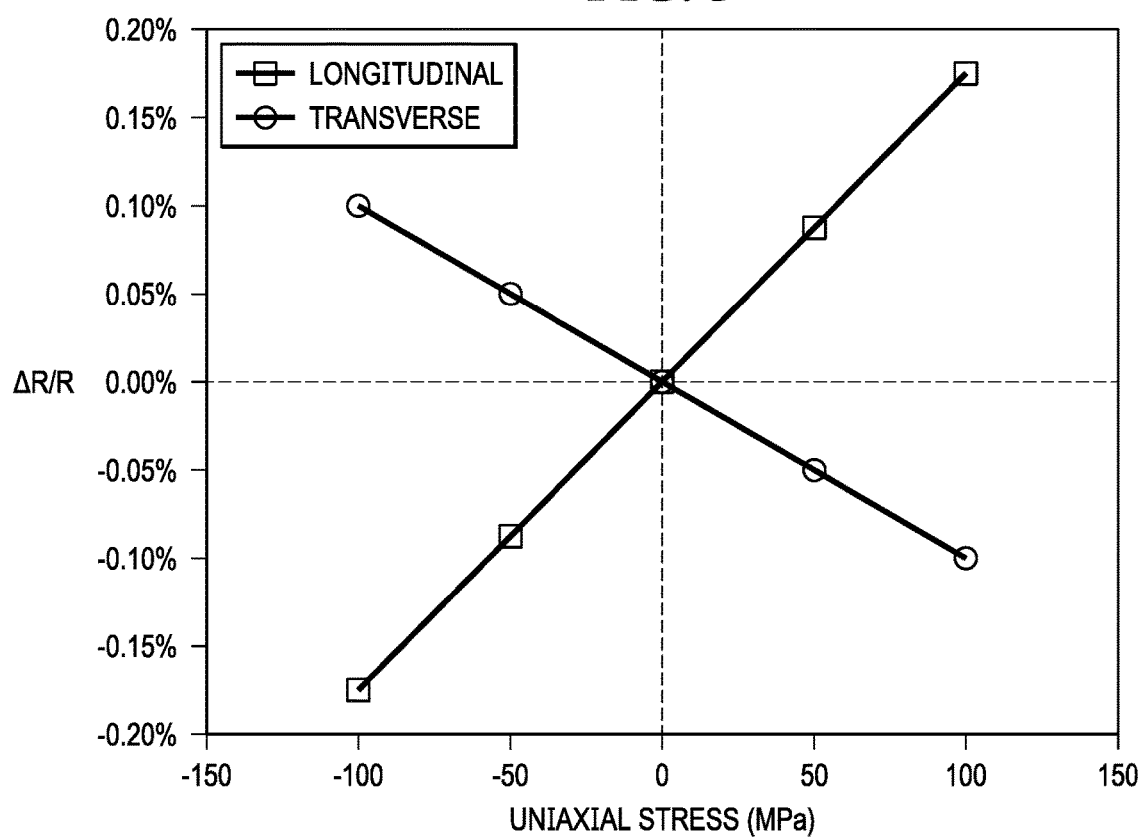
FIG. 3 is a plot illustrating example longitudinal strain sensitivity and transverse strain sensitivity for a TFR of the package of FIGS. 1A and 1B.

FIG. 3 is a plot illustrating example longitudinal strain sensitivity and transverse strain sensitivity for any one of TFRs 140. The longitudinal shift is approximately a linear function of a longitudinal component of the package-induced strains. The transverse shift is approximately a linear function of a transverse component of the package-induced strains. As referred to herein, an approximately linear function of shift correlates to a correlation coefficient, $R^2$, of 0.75 or greater for equally distributed data points over a range of stress or stains expected due to package-induced strains. Some examples may provide a much better fit to a linear function, just as an $R^2$, of 0.9 or greater, or even an $R^2$, of 0.95 or greater. Examples with a better fit to a linear function for both longitudinal strain sensitivity and transverse strain sensitivity allow a longitudinal shift due to the package-induced strains offsets a transverse shift due to the package-induced strains across a range of package-induced strains.

As represented by FIG. 3, TFRs 140 are 1.8 times more sensitive to longitudinal stress than transverse stress. For example, a uniaxial longitudinal stress of 100 megapascals (MPa) produces a ΔR/R of 0.18%. In comparison, a uniaxial transverse stress of 100 MPa produces a ΔR/R of −0.10%. Based on this ratio of longitudinal strain sensitivity to transverse strain sensitivity, TFRs 140 should be located on surface 131 of semiconductor die 130 such that the transverse strain is −1.8 times the longitudinal strain to eliminate resistance shift.

In some examples, each of TFRs 140 may be of the same design and specifications. For example, TFRs 140 may exhibit a strain sensitivity ratio of longitudinal strain sensitivity to transverse strain sensitivity within ten percent of each other. However, in other examples, a semiconductor die may include strain-sensitive component with different strain sensitivity ratios. In such examples, each strain-sensitive component should be located such that the longitudinal shift due to the package-induced strains offsets the transverse shift due to the package-induced strains.

Figure 4:
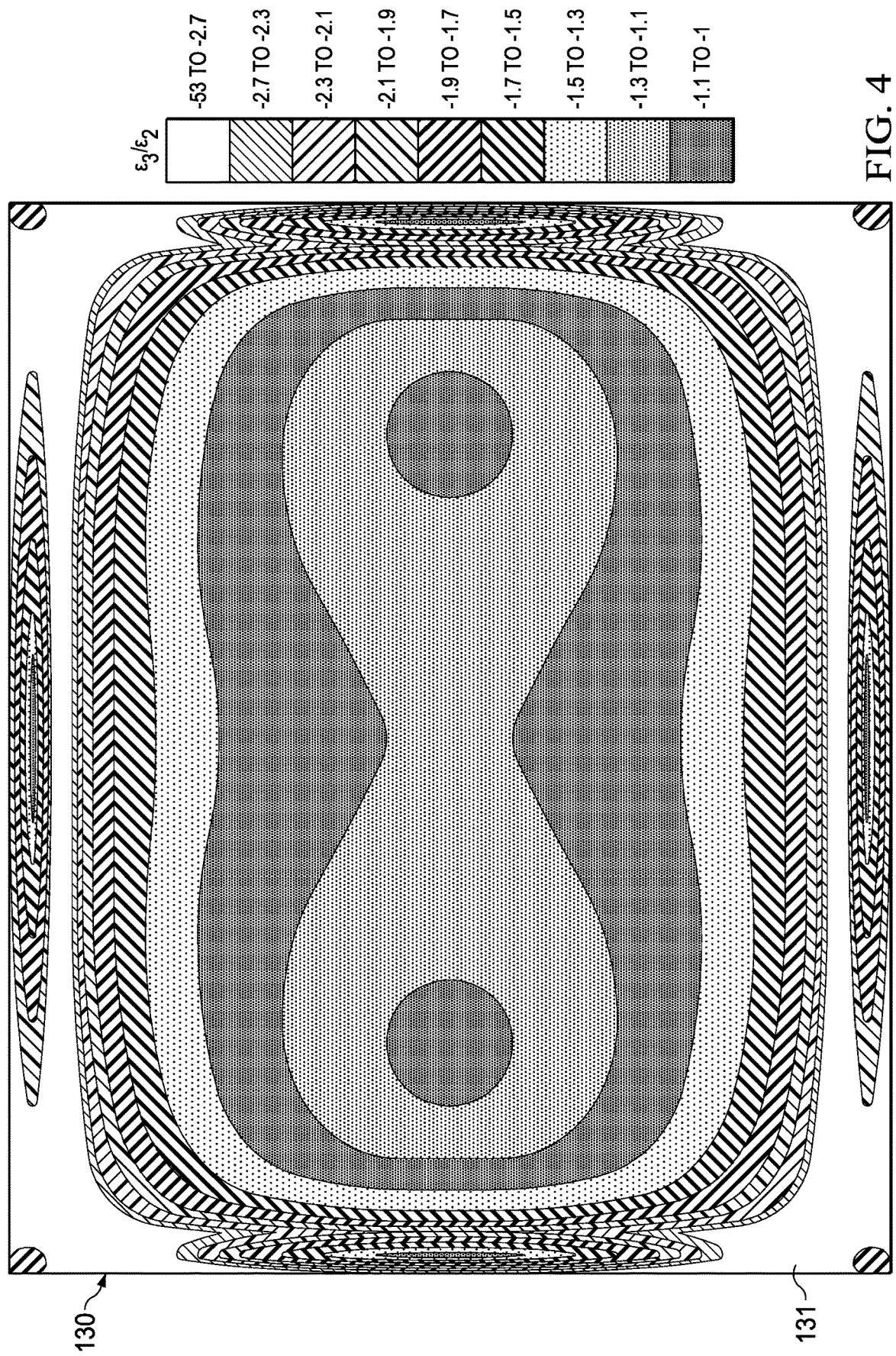
FIG. 4 illustrates isolines of principal strain ratios on the surface of the semiconductor die of the package of FIGS. 1A and 1B.
Figure 5:
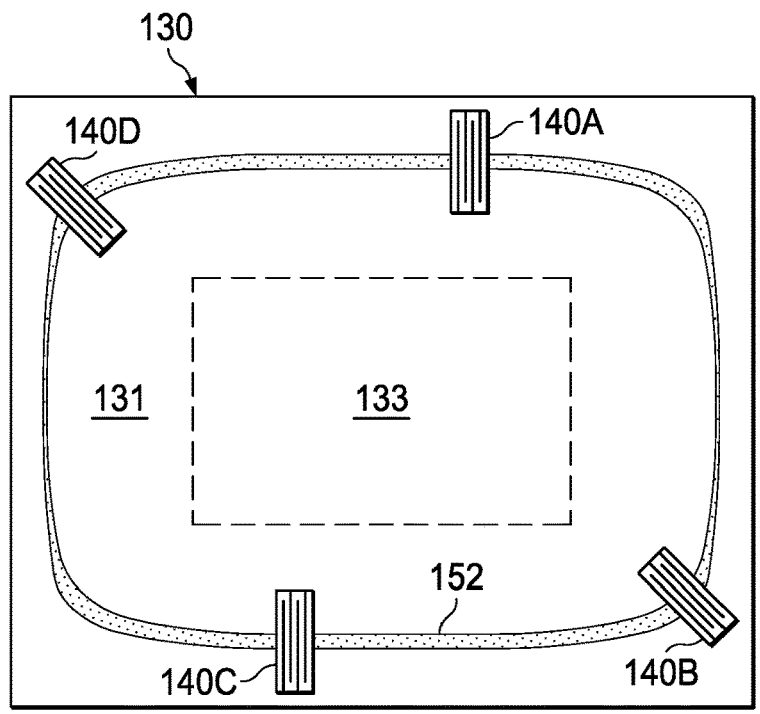
FIG. 5 illustrates a band of principal strains on the surface of the semiconductor die of the package of FIGS. 1A and 1B suitable for locating TFRs exhibiting the strain sensitivity of FIG. 3 in order to mitigate strain inducted shift.

FIG. 4 illustrates a principal strain ratios and isolines on the surface 131 of semiconductor die 130. FIG. 5 illustrates surface 131 of semiconductor die 130, with TFRs 140 orthogonal to a band 152 between two isolines, −1.9 to −1.7. Band 152 represents a range of principal strain ratios including principal strain ratio isoline 151 of FIG. 1A. While TFRs 140 extend beyond band 152, TFRs 140 are considered to be within a band 152 because the overlap band 152. In some example, the center of each of TFRs 140 is within band 152.

As used herein, a principal strain ratio is value of the maximum difference between orthogonal compressive strains along the die surface. An isoline for a principal strain ratio shows the relative orientation of the orthogonal compressive strains of the principal strain ratio. Parallel to the isoline is in the direction of maximum lateral compressive strain (ε3). Perpendicular to the isoline is in the direction of minimum lateral compressive strain (ε2).

While FIG. 4 illustrates principal strain in two dimensions, in the strict definition of principal strain in three dimensions, ε1 is maximum normal strain, ε2 is middle, ε3 is minimum. This is based on numerical value not magnitude, where tensile strain has a positive value, and compressive strain has a negative value. Because the silicon is predominantly under lateral compression in a package within the typical operating condition, ε3 is the "maximum compressive strain" (i.e. most negative strain) in a direction approximately along the die surface, and ε2 is the approximate "minimum lateral compressive strain". E1 is the strain in the approximately vertical/out-of-plane direction, and tends to be a positive value due to the Poisson effect.

For a majority of a die surface, as illustrated in FIG. 4, based on stress models, the orientation of the principal stress/strains is such that ε3 and ε2 are approximately parallel to the die surface, and ε1 is approximately normal to the die surface. Thus, the principal strain ratios and isolines on the surface 131 are applicable for identifying the locations for lateral resistive components like TFRs. However, near the very edges of surface 131 (such as within 100 μm), the stresses/strains approach a singularity condition and the principal strain orientation may deviate from surface 131.

With respect to the two-dimensional principal strain ratios illustrated in FIG. 4, at locations where the magnitude of the principal strain ratio of the die surface is equals the ratio of longitudinal and traverse elastoresistance coefficients, the TFR should be placed in orthogonal to the isoline representing the principal strain ratio. Such alignment provides the maximum possible difference between longitudinal and traverse stress applied to the TFR at those locations. For example, as shown in FIG. 1A, each of TFRs 140 are orthogonal to isoline 151, which represents a principle strain ratio of −1.8.

Equation 6 can be satisfied at any location on the die surface where the magnitude of the principal strain ratio of the die surface is equal to or greater than the magnitude of the ratio of longitudinal and traverse elastoresistance coefficients for the TFR. At locations where the magnitude of the principal strain ratio of the die surface is exceeds the ratio of longitudinal and traverse elastoresistance coefficients, the TFR should be misaligned with the isoline representing the principal strain ratio such that the TFR experiences longitudinal and traverse stress corresponding to the ratio of longitudinal and traverse elastoresistance coefficients for the TFR.

While the principal strain ratio represents the maximum orthogonal package-induced strain ratio on a strain-sensitive component at a particular location on the semiconductor die surface, the strain-sensitive component can be oriented to select a lower orthogonal package-induced strain ratio. For example, at any location on die surface 131, a strain-sensitive component could be oriented at a 45-degree angle to the principal strain ratio isoline in order to provide an orthogonal package-induced strain ratio of −1.0. In such a configuration, the magnitude of longitudinal strain on the strain-sensitive component would be equal to the magnitude of transverse strain on the strain-sensitive component.

In the present example, TFRs 140 are 1.8 times more sensitive to longitudinal stress than transverse stress. In other examples, strain-sensitive components may a different orthogonal strain sensitivity ratio for the strain-sensitive component. For example, some strain-sensitive components may provide orthogonal strain sensitivity ratio within a range of −1.0 to −10.0, such as −1.0 to −3.0. With an orthogonal strain sensitivity ratio of −1.0 any location on a die surface may be suitable for offsetting a longitudinal shift due to the package-induced strains with a transverse shift due to the package-induced strain. At any given location, the orientation of the strain sensitive component is selected such that the longitudinal strain on the component has the same magnitude as the transverse strain on the component.

A strain-sensitive component with orthogonal strain sensitivity ratio less than −10.0 may still facilitate offsetting a longitudinal shift due to the package-induced strains with a transverse shift due to the package-induced strain; however, such examples will require a location on the die surface with principal strain ratios of 10.0 or greater. As the example of FIG. 4 demonstrates, principal strain ratios greater than 10.0 may occur near the edges of a die surface, and/or coincide with high gradients of the principal strain ratio. Accordingly, offsetting a longitudinal shift due to the package-induced strains with a transverse shift due to the package-induced strain for strain-sensitive component with orthogonal strain sensitivity ratio less than −10.0 may be more challenging than for strain-sensitive components providing orthogonal strain sensitivity ratio within a range of −1.0 to −10.0.

As shown in FIG. 4, the area near the center of the die provides relatively smaller principal strain ratios, i.e., a value of the maximum difference between orthogonal compressive strains along die surface 131. In prior art applications, this center area is preferred for locating strain-sensitive components because the strain gradients near the center of the die surface tend to be lower than around the edges. Such prior art applications place components where stress/strain is more uniform, rather than in locations intended to reduce strain induced shift.

However, as disclosed herein, for stress sensitive components with a ratio of longitudinal and traverse elastoparameter coefficients (such as elastoresistance coefficients for TFRs) higher than the principal strain ratios near the center of the die, the center of the die is not suitable for offsetting longitudinal shift due to the package-induced strains with the transverse shift due to the package-induced strains. For this reason, depending on the properties of the strain-sensitive component, and the characteristic package-induced strains on the surface of a semiconductor die within a package, the strain-sensitive component may be located outside a center portion of the surface of the semiconductor die.

Semiconductor die 130 defines a length and a width, which is reflected in the length and width of surface 131, the width being smaller than the length. The thickness of semiconductor die 130 is perpendicular to surface 131, the thickness being smaller than the length and the width. In this example, center portion 133 of surface 131 of semiconductor die 130 ranges from 25 to 75 percent of the length, and ranges from 25 to 75 percent of the width. For strain-sensitive components with an orthogonal strain sensitivity ratio of −1.5 or less, center portion 133 does not facilitate offsetting a longitudinal shift due to the package-induced strains with a transverse shift due to the package-induced strain as the principal strain ratio is less than 1.5 within center portion 133.

Figure 6:
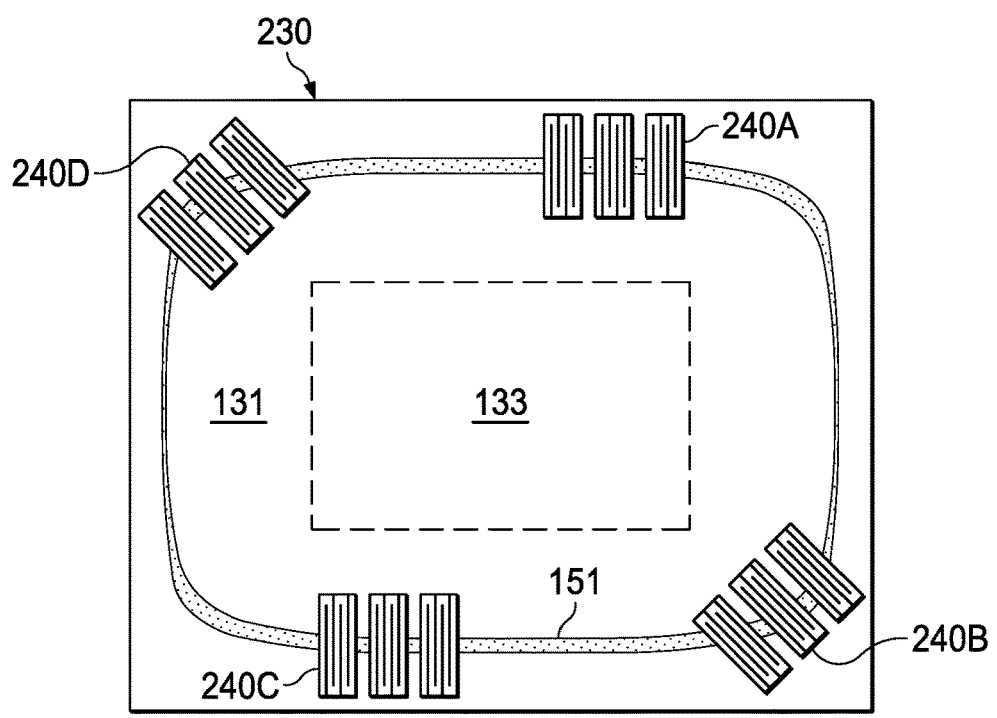
FIG. 6 illustrates the surface of a semiconductor die including arrays of TFRs located along a band of principal strains in order to mitigate strain inducted shift.

FIG. 6 illustrates a surface 131 of semiconductor die 230 including arrays of TFRs 240A:240D (collectively, "TFR arrays 240") located on surface 131. Semiconductor die 230 is substantially similar to semiconductor die 130 except that TFRs 140 have been replaced with TFR arrays 240. Elements of semiconductor die 230 with the same numbers as semiconductor die 130 are the same or substantially similar to those elements in semiconductor die 130. For brevity, such elements are described in limited or no detail with respect to semiconductor die 230.

The TFRs of TFR arrays 240 are located on the surface 131 of the semiconductor die 230 such that shifts of each of the first array of adjacent strain-sensitive components due to the package-induced strains offset, as described with respect to TFRs 140. Accordingly, semiconductor die 230 offers the same advantages in this regard as semiconductor die 130. In addition, TFR arrays 240 may provide further precision and redundancy compared single TFRs 140 of semiconductor die 130.

TFR arrays 240 are each separated from each other by at least 25 percent of a width of surface 131. Each TFR in a TFR array 240 is adjacent to and generally aligned with the other TFRs in the TFR array 240. However, there may be some intentional misalignment between TFRs in a TFR array 240 to account for curves in the principal strain ratio isoline associated with the TFR array 240.

Figure 7:
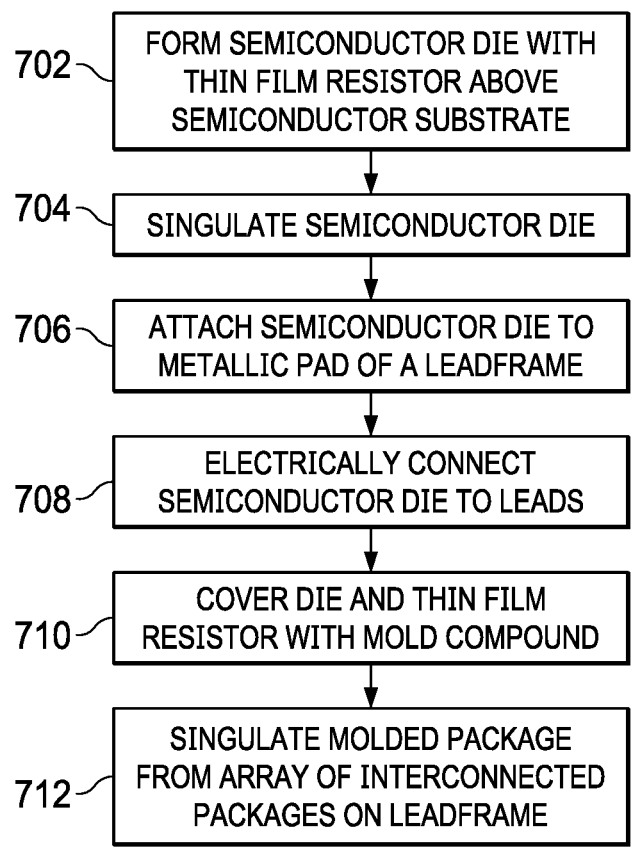
FIG. 7 is flowchart of a method of manufacturing a semiconductor package with strain-sensitive components located on the surface of a semiconductor die such that a longitudinal shift due to the package-induced strains offsets a transverse shift due to the package-induced strains.

FIG. 7 is flowchart of a method of manufacturing a semiconductor package with strain-sensitive components located on the surface of a semiconductor die such that a longitudinal shift due to the package-induced strains offsets a transverse shift due to the package-induced strains. For clarity, the techniques of FIG. 7 are described with respect to package 100; however, the described techniques may also be readily adapted to alternative package configurations.

The semiconductor die, such as any of semiconductor dies 130, 230, is formed on a semiconductor wafer including an array of semiconductor dies. Forming the semiconductor die includes forming a multilayer dielectric including metallization layers with functional circuitry and a TFR 140 above a semiconductor substrate (FIG. 7, step 702). The semiconductor wafer is cut to singulate the semiconductor dies from the wafer (FIG. 7, step 704).

The semiconductor die is attached to a metallic pad of a leadframe by securing an inactive side of semiconductor die 130 to the metallic pad with die attach paste (FIG. 7, step 706). The semiconductor die, including TFRs 140, is electrically coupled to one or more leads 116 (FIG. 7, step 708). For example, electrically coupling semiconductor die 130 to leads 116 may include forming wire bonds 117 between bond pads 135 and leads 116.

Next, the partially assembled device is molded, thereby covering semiconductor die 130, TFRs 140, and wire bonds 117, and partially covering metallic pad 114 and leads 116 with a mold compound 118, with metallic pad 114 and leads 116 remaining exposed on an outer surface of the semiconductor package (FIG. 7, step 710). Finally, the array of packages on a common leadframe are singulated with a cutting operation to separate each package from the leadframe (FIG. 7, step 712).

The singulated semiconductor package 100, including semiconductor die 130 and mold compound 118, defines the relative magnitudes of orthogonal package-induced strains on TFRs 140 on the semiconductor die surface 131. TFRs 140 are strain-sensitive components located on surface 131 such that the longitudinal shift due to the package-induced strains offsets the transverse shift due to the package-induced strains. The location and orientation for TFRs 140 is designed according to the known ratio of orthogonal package-induced strains.

Determining the ratio of orthogonal package-induced strains in order to determine the appropriate location and orientation for TFRs 140 may include stress modeling and physical testing of prototype package designs. However, once the proper location and orientation for TFRs 140 on surface 131 is determined, by modeling, testing or a combination thereof, package-induced strains will have limited effect on the resistance of TFRs 140.

Examples of this disclosure include techniques for selecting positions and orientation of strain-sensitive components on a semiconductor die based on the physical structure of a semiconductor die and further based on the effect of strain on the sensitive components in various dimensions. While the techniques may be applied to preexisting semiconductor dies and strain-sensitive components, the semiconductors dies may be designed to adjust package-induced orthogonal compressive strain ratios. In addition, sensitive components may be designed to provide a desired sensitivity to strain in different dimensions. Designing die and components to balance strain provides greater flexibility in component layouts compared to using only existing die and component designs.

The specific techniques for mitigating strain inducted shift in semiconductor packages, including techniques described with respect to package 100, and semiconductor dies 130 and 230 are merely illustrative of the general inventive concepts included in this disclosure as defined by the following claims.

What is claimed is:

1. A semiconductor die, comprising:
   a semiconductor substrate;
   a dielectric multilayer disposed on the semiconductor substrate, the dielectric multilayer including a top surface facing away the semiconductor substrate; and
   a strain-sensitive component disposed on the top surface, wherein a circuit parameter of the strain-sensitive component exhibits a longitudinal shift in response to a longitudinal strain and a transverse shift in response to a transverse strain, wherein—
   the strain-sensitive component is disposed at a location of the top surface, wherein the location is determined such that the longitudinal shift offsets the transverse shift when package-induced strains generate the longitudinal and transverse strains.

2. The semiconductor die of claim 1, wherein the location is outside a center portion of the top surface, the center portion ranging from 25 to 75 percent of a length of the top surface, and from 25 to 75 percent of a width of the top surface.

3. The semiconductor die of claim 2, wherein the package-induced strains at the location is greater than the package-induced strains at the center portion of the top surface.

4. The semiconductor die of claim 2, wherein an isoline of a principal strain ratio on the top surface includes the location of the top surface, the isoline surrounding the center portion of the top surface.

5. The semiconductor die of claim 4, wherein the principal strain ratio is related to a ratio between the longitudinal and transverse strains.

6. The semiconductor die of claim 4, wherein:
   the strain-sensitive component is a thin-film resistor; and
   the principal strain ratio is related to a ratio between longitudinal and transverse elastoresistance coefficients of the thin-film resistor.

7. The semiconductor die of claim 4, wherein the strain-sensitive component is a thin-film resistor having a width and a length greater than the width, the thin-film resistor configured to conduct current primarily in a direction parallel to the length wherein—
   the width of the thin-film resistor is aligned with the isoline; and
   the isoline intersects the thin-film resistor substantially at a mid-point of the length.

8. The semiconductor die of claim 7, wherein the thin-film resistor has a serpentine structure including multiple legs, each one of the multiple legs extended along the length.

9. The semiconductor die of claim 1, wherein, at the location, a magnitude of the longitudinal shift is within twenty percent of a magnitude of the transverse shift.

10. The semiconductor die of claim 1, wherein the location is away from one or more edges of the top surface by 100 micrometers (μm) or greater.

11. The semiconductor die of claim 1, wherein a semiconductor package determines the package-induced strains acting on the strain-sensitive component, the semiconductor package including a metallic pad configured to have the semiconductor die attached thereto and a mold compound covering the semiconductor die and the strain-sensitive component.

12. The semiconductor die of claim 1, wherein:
   the longitudinal shift is approximately a linear function of the longitudinal strain having a first slope with a first polarity; and
   the transverse shift is approximately a linear function of the transverse strain having a second slope a second polarity.

13. The semiconductor die of claim 12, wherein the first polarity is opposite to the second polarity.

14. The semiconductor die of claim 1, wherein:
   the circuit parameter of the strain-sensitive component has longitudinal strain sensitivity and transverse strain sensitivity; and
   a ratio of the longitudinal strain sensitivity to the transverse strain sensitivity ranges between −1.0 and −10.0.

15. The semiconductor die of claim 1, wherein the circuit parameter includes resistance, reactance, impedance, frequency, capacitance, or a combination thereof.

16. The semiconductor die of claim 1, wherein the strain-sensitive component includes resistors, inductors, capacitors, oscillators, transistors, or a combination thereof.

17. A semiconductor die, comprising:
   a semiconductor substrate;
   a dielectric multilayer over the semiconductor substrate, the dielectric multilayer including a top surface facing away the semiconductor substrate; and
   a plurality of strain-sensitive components disposed on the top surface, wherein a circuit parameter of the strain-sensitive components exhibits a longitudinal shift in response to a longitudinal strain and a transverse shift in response to a transverse strain, wherein—
   individual strain-sensitive components of the plurality are disposed at locations of the top surface, wherein the locations are determined such that, at each location, the longitudinal shift offsets the transverse shift when package-induced strains generate the longitudinal and transverse strains.

18. The semiconductor die of claim 17, wherein a semiconductor package determines the package-induced strains acting on the plurality of strain-sensitive components, the semiconductor package including a metallic pad configured to have the semiconductor die attached thereto and a mold compound covering the semiconductor die and the plurality of strain-sensitive components.

19. The semiconductor die of claim 17, wherein the locations are outside a center portion of the top surface, the center portion ranging from 25 to 75 percent of a length of the top surface, and from 25 to 75 percent of a width of the top surface.

20. The semiconductor die of claim 19, wherein an isoline of a principal strain ratio on the top surface includes the locations of the top surface, and surrounds the center portion of the top surface, the principal strain ratio being related to a ratio between the transverse strain and the longitudinal strain.

21. The semiconductor die of claim 20, wherein the strain-sensitive components are thin-film resistors that each has a width and a length greater than the width, the thin-film resistors configured to conduct current primarily in a direction parallel to the length, and wherein
   the widths of the thin-film resistors are aligned with the isoline; and
   the isoline intersects the thin-film resistors substantially at mid-points of the length.

22. The semiconductor die of claim 17, wherein the circuit parameters of individual strain-sensitive components exhibit strain sensitivity ratios within ten percent of each other, the strain sensitivity ratio being a ratio of longitudinal strain sensitivity to transverse strain sensitivity.

23. The semiconductor die of claim 17, wherein distances between individual strain-sensitive components are greater than 25 percent of a width of the top surface.

24. A semiconductor die, comprising:
a semiconductor substrate;
a dielectric multilayer over the semiconductor substrate, the dielectric multilayer including a top surface facing away the semiconductor substrate; and
a plurality of arrays of strain-sensitive components disposed on the top surface, wherein a circuit parameter of the strain-sensitive components exhibits a longitudinal shift in response to a longitudinal strain and a transverse shift in response to a transverse strain, wherein—
individual arrays of strain-sensitive components are disposed at locations of the top surface, wherein the locations are determined such that, at each location, the longitudinal shift offsets the transverse shift when package-induced strains generate the longitudinal and transverse strains.

25. The semiconductor die of claim 24, wherein a semiconductor package determines the package-induced strains acting on the plurality of arrays of strain-sensitive components, the semiconductor package including a metallic pad configured to have the semiconductor die attached thereto and a mold compound covering the semiconductor die and the plurality of arrays of strain-sensitive components.

26. The semiconductor die of claim 24, wherein the locations are outside a center portion of the top surface, the center portion ranging from 25 to 75 percent of a length of the top surface, and from 25 to 75 percent of a width of the top surface.

27. The semiconductor die of claim 25, wherein an isoline of a principal strain ratio on the top surface includes the locations of the top surface, and surrounds the center portion of the top surface, the principal strain ratio being related to a ratio between the transverse strain and the longitudinal strain.

28. The semiconductor die of claim 27, wherein the strain-sensitive components are thin-film resistors that each has a width and a length greater than the width, the thin-film resistors configured to conduct current primarily in a direction parallel to the length wherein—
the widths of the thin-film resistors are aligned with the isoline; and
the isoline intersects the thin-film resistors substantially at mid-points of the length.

29. The semiconductor die of claim 24, wherein distances between individual arrays of strain-sensitive components are greater than 25 percent of a width of the top surface.

\* \* \* \* \*